United States Patent
Wang et al.

(10) Patent No.: US 11,562,991 B2
(45) Date of Patent: Jan. 24, 2023

(54) BACKPLANE AND MANUFACTURING METHOD THEREOF, BACKLIGHT MODULE, AND DISPLAY PANEL USING MICRO LIGHT-EMITTING DIODES

(71) Applicants: Hefei Xinsheng Optoelectronics Technology Co., Ltd., Anhui (CN); BOE Technology Group Co., Ltd., Beijing (CN)

(72) Inventors: Jing Wang, Beijing (CN); Dong Li, Beijing (CN); Weiwei Chu, Beijing (CN); Wenjie Xu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 149 days.

(21) Appl. No.: 16/831,096

(22) Filed: Mar. 26, 2020

(65) Prior Publication Data
US 2021/0159219 A1 May 27, 2021

(30) Foreign Application Priority Data
Nov. 22, 2019 (CN) .......................... 201911158430.5

(51) Int. Cl.
*H01L 33/00* (2010.01)
*H01L 25/075* (2006.01)
(Continued)

(52) U.S. Cl.
CPC .......... *H01L 25/0753* (2013.01); *H01L 33/52* (2013.01); *H01L 33/60* (2013.01);
(Continued)

(58) Field of Classification Search
CPC ..... H01L 25/0753; H01L 33/52; H01L 33/60; H01L 33/62; H01L 2933/005;
(Continued)

(56) References Cited

U.S. PATENT DOCUMENTS

| 2014/0267683 A1* | 9/2014 | Bibl | ...................... G09G 3/006 348/87 |
| 2017/0125392 A1 | 5/2017 | Bibl et al. | |

(Continued)

FOREIGN PATENT DOCUMENTS

| CN | 106449657 A | 2/2017 |
| CN | 107680960 A | 2/2018 |

(Continued)

OTHER PUBLICATIONS

Dec. 4, 2020—(CN) Second Office Action Appn 201911158430.5 with English Translation.

(Continued)

*Primary Examiner* — Ismail A Muse
(74) *Attorney, Agent, or Firm* — Banner & Witcoff, Ltd.

(57) ABSTRACT

A backplane, a manufacturing method thereof, a backlight module and a display panel are provided. The backplane includes a base substrate; a first conductive layer located on the base substrate and including a wire; a first protection layer located at a side of the first conductive layer facing away from the base substrate; a second conductive layer located on the first protection layer and including a conductive sub-layer, the conductive sub-layer penetrating the first protection layer to be connected with the wire; a second protection layer located at a side of the second conductive layer facing away from the base substrate; a micro light-emitting diode (LED) penetrating the second protection layer to be connected with the conductive sub-layer; and a metallic reflective layer, located on the second protection (Continued)

layer and configured to reflect light irradiated onto the metallic reflective layer from the micro LED.

15 Claims, 7 Drawing Sheets

(51) Int. Cl.
  *H01L 33/52* (2010.01)
  *H01L 33/60* (2010.01)
  *H01L 33/62* (2010.01)
(52) U.S. Cl.
  CPC ........ *H01L 33/62* (2013.01); *H01L 2933/005* (2013.01); *H01L 2933/0058* (2013.01); *H01L 2933/0066* (2013.01)
(58) Field of Classification Search
  CPC ..... H01L 2933/0058; H01L 2933/0066; H01L 2933/0025; H01L 33/44; H01L 27/156
  See application file for complete search history.

(56) References Cited

U.S. PATENT DOCUMENTS

| | | | |
|---|---|---|---|
| 2018/0182746 A1 | 6/2018 | Bibl et al. | |
| 2019/0165317 A1 | 5/2019 | Lai et al. | |
| 2019/0229170 A1* | 7/2019 | Tsai | H01L 51/56 |
| 2021/0126154 A1* | 4/2021 | Kim | H01L 33/387 |
| 2021/0313496 A1* | 10/2021 | Kanaya | G09F 9/33 |

FOREIGN PATENT DOCUMENTS

| | | |
|---|---|---|
| CN | 107994059 A | 5/2018 |
| CN | 108828841 A | 11/2018 |
| CN | 109065529 A | 12/2018 |
| CN | 109597245 A | 4/2019 |
| CN | 110018593 A | 7/2019 |

OTHER PUBLICATIONS

Jul. 2, 20207—(CN) First Office Action Appn 201911158430.5 with English Translation.

* cited by examiner

BACKPLANE AND MANUFACTURING METHOD THEREOF, BACKLIGHT MODULE, AND DISPLAY PANEL USING MICRO LIGHT-EMITTING DIODES

CROSS-REFERENCE

The application claims priority to Chinese patent application No. 201911158430.5 filed on Nov. 22, 2019. For all purposes under the U.S. law, the entire disclosure of the aforementioned application is incorporated by reference as part of the disclosure of this application.

TECHNICAL FIELD

Embodiments of the present disclosure relate to a backplane and a manufacturing method thereof, a backlight module, and a display panel.

BACKGROUND

Mini-Light Emitting Diode (Mini LED) technology refers to LED technology in which an area size of a light-emitting chip is in a range of 100 µm-200 µm. Display products obtained by applying the Mini LED technology into a backlight unit (BLU) are advantageous in good contrast ratio, high brightness, small thickness and the like as compared with conventional display products.

SUMMARY

Embodiments of the present disclosure provide a backplane and a manufacturing method thereof, a backlight module, and a display panel. The backplane is characterized by low power consumption and long service life.

At least one embodiment of the present disclosure provides a backplane, including a base substrate; a first conductive layer located on the base substrate, the first conductive layer including a wire; a first protection layer located at a side of the first conductive layer facing away from the base substrate; a second conductive layer located at a side of the first protection layer facing away from the base substrate, the second conductive layer including a conductive sub-layer, the conductive sub-layer penetrating the first protection layer to be connected with the wire; a second protection layer located at a side of the second conductive layer facing away from the base substrate; a micro light-emitting diode (LED) penetrating the second protection layer to be connected with the conductive sub-layer; and a metallic reflective layer, located at a side of the second protection layer facing away from the base substrate and configured to reflect light irradiated onto the metallic reflective layer from the micro LED.

According to the backplane provided by some embodiments of the present disclosure, the backplane further includes: an antioxidation layer located between the metallic reflective layer and the micro LED.

According to the backplane provided by some embodiments of the present disclosure, the backplane further includes: a third protection layer located between the antioxidation layer and the micro LED.

According to the backplane provided by some embodiments of the present disclosure, the third protection layer completely covers both of the metallic reflective layer and the antioxidation layer.

According to the backplane provided by some embodiments of the present disclosure, the micro LED is connected with the conductive sub-layer through a via hole penetrating the third protection layer and the second protection layer.

According to the backplane provided by some embodiments of the present disclosure, the metallic reflective layer and the antioxidation layer are provided with a via hole, an orthographic projection of the via hole penetrating the third protection layer and the second protection layer on the base substrate is completely within an orthographic projection of the via hole in the metallic reflective layer and the antioxidation layer on the base substrate.

According to the backplane provided by some embodiments of the present disclosure, the second protection layer, the metallic reflective layer, the antioxidation layer and the third protection layer are provided with a first via hole, a second via hole, a third via hole and a fourth via hole, respectively, the micro LED is connected with the conductive sub-layer through the first via hole, the second via hole, the third via hole and the fourth via hole.

According to the backplane provided by some embodiments of the present disclosure, a pin of the micro LED has a height smaller than a thickness of the second protection layer so as to isolate the pin from the metallic reflective layer.

According to the backplane provided by some embodiments of the present disclosure, a thickness of the first protection layer is greater than a thickness of the first conductive layer, and a thickness of the second protection layer is greater than a thickness of the second conductive layer.

According to the backplane provided by some embodiments of the present disclosure, the wire includes a first sub-layer and a second sub-layer which are stacked; the first sub-layer is closer to the base substrate than the second sub-layer to the base substrate; and a thickness of the first sub-layer is smaller than a thickness of the second sub-layer.

According to the backplane provided by some embodiments of the present disclosure, a material of the metallic reflective layer includes Ag, and a material of the antioxidation layer includes indium tin oxide (ITO).

According to the backplane provided by some embodiments of the present disclosure, a material of the base substrate is glass.

At least one embodiment of the present disclosure further provides a backlight module, including any of the above-described backplanes and an optical film.

At least one embodiment of the present disclosure further provides a display panel, including any of the above-described backlight modules and a display module; the display module, the optical film and the backplane are sequentially arranged.

At least one embodiment of the present disclosure further provides a manufacturing method of a backplane, including: forming a first conductive layer on a base substrate, the first conductive layer including a wire; forming a first protection layer on the first conductive layer; forming a second conductive layer on the first protection layer, the second conductive layer including a conductive sub-layer, the conductive sub-layer penetrating the first protection layer to be connected with the wire; forming a second protection layer on the second conductive layer; providing a micro light-emitting diode (LED), the micro LED penetrating the second protection layer to be connected with the conductive sub-layer; and forming a metallic reflective layer on the second protection layer, the metallic reflective layer being configured to reflect light irradiated on the metallic reflective layer from the micro LED.

According to the manufacturing method of the backplane provided by some embodiments of the present disclosure, after forming the metallic reflective layer and before providing the micro LED, the manufacturing method further includes: forming an antioxidation layer.

According to the manufacturing method of the backplane provided by some embodiments of the present disclosure, after forming the antioxidation layer and before providing the micro LED, the manufacturing method further includes: forming a third protection layer.

According to the manufacturing method of the backplane provided by some embodiments of the present disclosure, forming the third protection layer and the second protection layer by using a same mask, the micro LED being connected with the conductive sub-layer through a via hole penetrating the third protection layer and the second protection layer.

According to the manufacturing method of the backplane provided by some embodiments of the present disclosure, forming the wire in the first conductive layer includes: forming a first sub-layer and a second sub-layer that are stacked on the base substrate. The first sub-layer is closer to the base substrate than the second sub-layer to the base substrate, and a thickness of the first sub-layer is smaller than a thickness of the second sub-layer.

According to the manufacturing method of the backplane provided by some embodiments of the present disclosure, forming the first sub-layer and the second sub-layer that are stacked includes: forming a first conductive film on the base substrate; forming photoresist to cover the first conductive film, the photoresist including a to-be-retained portion and a to-be-removed portion; removing the to-be-removed portion to expose part of the first conductive film; forming a second conductive film in a region of the first conductive film not covered by the photoresist by using an electroplating process; and removing the to-be-retained portion and a portion of the first conductive film located below the to-be-retained portion, to form the first sub-layer and the second sub-layer that are stacked.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "on," "under," "right," "left" and the like are only used to indicate relative position relationship, and when the position of the described object is changed, the relative position relationship may be changed accordingly.

At present, major manufactures mainly focus on the manufacture, research and development of printed circuit board (PCB) based Mini LED backlight modules. However, conventional PCB based Mini LED backlight modules involve higher power consumption, thus affecting the service life of the product. Currently, it's urged to develop a new product to satisfy the requirements from the market.

Figure 1A:
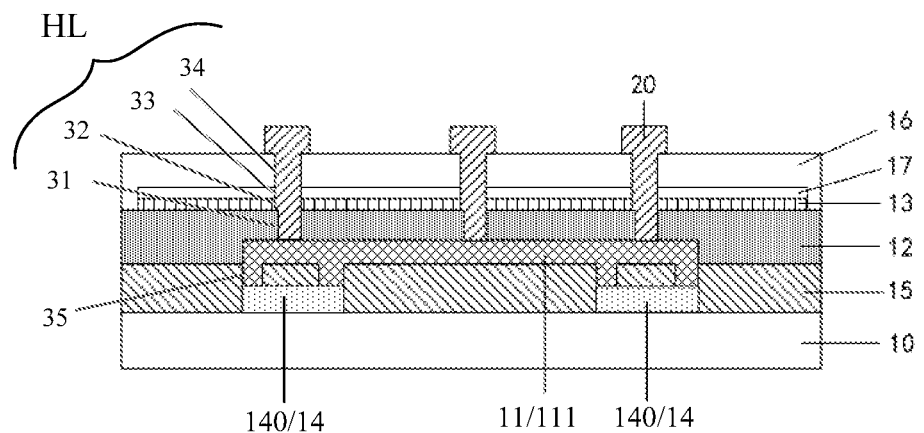
FIG. 1A is a structural diagram of a backplane provided by an embodiment of the present invention.

An embodiment of the present disclosure provides a backplane applied to backlight. Referring to FIG. 1A, the backplane includes: a base substrate 10; and a first conductive layer 14, a first protection layer 15, a second conductive layer 11, a second protection layer 12, a metallic reflective layer 13, an antioxidation layer 17 and a plurality of micro LEDs 20 which are sequentially located on the base substrate 10 in a direction facing away from the base substrate 10. In some other embodiments, the antioxidation layer 17 may be omitted.

A material of the above-described base substrate 10 is not limited in the embodiments of the present disclosure. The material may be a base material for PCB, and may also be glass; of course, other base materials are also feasible, which may be determined according to actual conditions.

Materials of the above-described first conductive layer 14, first protection layer 15, second conductive layer 11, second protection layer 12 and metallic reflective layer 13 are not limited in the embodiments of the present disclosure.

For example, in some embodiments, in order to enable the first protection layer 15 to effectively protect the first conductive layer 14, a thickness of the first conducive layer 14 may be 1.8 μm-5.2 μm, and a thickness of the first protection layer 15 may be 1.5-2 times of the thickness of the first conductive layer 14.

The material of the above-described first conducive layer 14 may be a metal, for example, copper (Cu). Cu has good conductivity and facilitates to reduce a response time of the backplane. For example, if a size of the backplane is 12.3 cun-75 cun, a thickness of the Cu layer may be 1.8 μm-5.2 μm; in this case, the thickness of the first protection layer 15 may be 1.5-2 times of that of the Cu layer, so as to effectively protect the Cu layer.

The material of the above-described second conducive layer 11 may also be a metal, and may be as same as or different from the material of the first conductive layer 14. In order to lower the manufacturing difficulty and cost, the first conductive layer 14 and the second conductive layer 11 may be formed by using the same material.

The material of the first protection layer 15 may be silicon nitride, and may also be other materials, of course, as long as it functions for insulation and protection. The metallic reflective layer 13 may be formed by using a material functioning for reflecting light. The material of the metallic reflective layer 13 may be a metal such as Ag (silver, Argentum).

The material of the first protection layer 15 may be as same as or different from the material of the second protection layer 12. In order to lower the manufacturing difficulty and cost, the second protection layer 12 and the first protection layer 15 may be formed by using the same material.

Magnitudes of thicknesses of the first conductive layer 14 and the first protection layer 15 are not limited in the embodiments of the present disclosure. In order to protect the first conductive layer 14 in a better way, the thickness of the first protection layer 15 may be greater than the thickness of the first conductive layer 14.

Magnitudes of thicknesses of the second conductive layer 11 and the second protection layer 12 are not limited in the embodiments of the present disclosure. In order to protect the second conductive layer 11 in a better way, the thickness of the second protection layer 12 may be greater than the thickness of the second conductive layer 11.

The above-described backplane may be applied in a display panel of a liquid crystal display (LCD), and may be applied in any product that needs a backplane. Particular ranges for application of the backplane will not be limited in the embodiments of the present disclosure.

The number of the micro LEDs is not limited in the embodiments of the present disclosure, but is particularly determined according to a size of the backplane. Meanwhile, a color of light emitted by the above described micro LED is not limited, either, and may be any one of red light, yellow light, blue light and the like or any combination thereof.

For example, the backplane further includes at least one light-emitting region; the plurality of micro LEDs are divided into a plurality of micro LED groups according to the region where the micro LED is located; the micro LEDs included in each of the micro LED groups are all located in the same light-emitting region.

For example, the second conductive layer 11 includes a plurality of conductive sub-layers 111 which are not connected with each other, and the plurality of conductive sub-layers 111 are insulated from each other; each of the conductive sub-layers corresponds to one micro LED group, and each of the conductive sub-layers is electrically connected with the micro LED(s) in the corresponding micro LED group.

For example, the first conductive layer 14 includes a plurality of wires, each of the wires corresponds to one conductive sub-layer, and each of the wires is electrically connected with the corresponding conductive sub-layer. Of course, each of the conductive sub-layers may correspond to more than one wire.

For example, the backplane including at least one light-emitting region as mentioned above refers to that, the backplane may include only one light-emitting region, or the backplane may include two or more than two light-emitting regions. The particular number of the light-emitting region may be determined according to the size of the backplane.

For example, the above-described one conductive sub-layer corresponds to one micro LED group, and is electrically connected with the micro LEDs in the micro LED group, so as to regulate and control the micro LEDs in different light-emitting regions through the plurality of conductive sub-layers, respectively.

It should be noted that, the number of the above-described wire corresponding to one conductive sub-layer may be one, and may also be two or more than two; this number may be determined according to the number of the micro LEDs connected with this conducive sub-layer. FIG. 1A is drawn with reference to the case where the first conductive layer 14 includes two wires 140, the second conductive layer 11 includes one conductive sub-layer, and the two wires correspond to one conductive sub-layer, by way of example.

An embodiment of the present disclosure provides a backplane. Compared with the structure that functions for reflecting by using photosensitive white oil in conventional technologies, the backplane provided by the embodiment of the present disclosure adopts a metallic reflective layer; because the metallic reflective layer has a reflectivity much greater than that of the white oil, the light emitted by the micro LED towards a non-display side can be reflected to a light-emitting side as much as possible, so as to increase an utilization ratio of the micro LED, and hence to reduce the power consumption and extend the service life. At the same time, it also enables to achieve regional regulation and control of the micro LEDs, and to provide backlight source with higher quality. As illustrated in FIG. 1A, the side of the base substrate 10 provided with the micro LED 20 is referred to as the light-emitting side.

Optionally, in order to prevent the metallic reflective layer from oxidation, referring to FIG. 1A, an antioxidation layer 17 covers the metallic reflective layer 13. For example, the antioxidation layer 17 and the metallic reflective layer 13 have the same pattern. For example, an orthographic projection of the antioxidation layer 17 on the base substrate 10 coincides with an orthographic projection of the metallic reflective layer 13 on the base substrate 10. As illustrated in FIG. 1A, the antioxidation layer 17 is located at a side of the metallic reflective layer 13 away from the base substrate 10.

A material of the antioxidation layer 17 is not particularly limited in the embodiments of the present disclosure. For example, the material of the antioxidation layer 17 includes indium tin oxide (ITO), but is not limited thereto. By way of example, if the material of the metallic reflective layer is Ag, the material of the antioxidation layer may be indium tin oxide (ITO). In such case, the reflectivity of the metallic reflective layer is raised by at least 5% as compared with the photosensitive white oil.

Optionally, referring to FIG. 1A, in order to further protect the metallic reflective layer 13, the backplane further includes a third protection layer 16 located at a side of the antioxidation layer 17 away from the base substrate 10.

A material of the above-described third protection layer 16 may be as same as or different from that of the first protection layer 15 and the second protection layer 12. In order to lower the manufacturing difficulty, the third protection layer 16, the second protection layer 12 and the first protection layer 15 may be formed by using the same material.

Optionally, the second protection layer 12, the metallic reflective layer 13, the antioxidation layer 17 and the third protection layer 16 are provided with a first via hole 31, a second via hole 32, a third via hole 33 and a fourth via hole 34, respectively. Referring to FIG. 1A, the micro LED 20 is connected with the corresponding conductive sub-layer of the second conductive layer 11 through the first via hole 31, the second via hole 32, the third via hole 33 and the fourth via hole 34, so as to enable the micro LED to be electrically connected with the corresponding conductive sub-layer. Such way of electrical connection is simply to implement.

For example, referring to FIG. 1A, a via hole HL penetrates the second protection layer 12, the metallic reflective layer 13, the antioxidation layer 17 and the third protection layer 16. The micro LED 20 is connected with the corresponding conductive sub-layer of the second conductive layer 11 through the via hole HL, thereby enabling the micro LED to be electrically connected with the corresponding conductive sub-layer.

Optionally, the first protection layer 15 is provided with a fifth via hole 35, and the wire 140 is connected with the corresponding conductive sub-layer 111 through the fifth via hole 35, thereby enabling the wire to be electrically connected with the corresponding conductive sub-layer. Such way of electrical connection is simply to implement. The number of the fifth via hole is not limited in the embodiments of the present disclosure. One wire may be connected with the corresponding conductive sub-layer through one fifth via hole, and may also be connected with the corresponding conductive sub-layer through a plurality of fifth via holes. FIG. 1A is drawn with reference to the case where one wire is connected with the corresponding conductive sub-layer through two fifth via holes by way of example.

Optionally, a material of the above-described base substrate 10 is glass, but is not limited thereto.

A conventional PCB substrate involves at least two problems that, on one aspect, the base material for PCB has a small thermal diffusion coefficient, resulting in poor heat dissipation; and on the other aspect, a flatness level of the PCB substrate cannot satisfy the requirements for subsequent bonding process, resulting in a restriction to a size of the PCB substrate; when a large-sized backplane needs to be manufactured, it requires to splice a plurality of PCB substrates together, which undoubtedly increases the material consumption due to the precision and buckling issues of the PCB substrate, thereby raising the manufacturing cost. As a comparison, the glass substrate has advantages of excellent heat dissipation, high flatness level, good control of buckling issue, high precision of circuit wirings, applicability of small-sized chips and the like; moreover, the above-described backlight structure is not subject to any size restriction when manufactured on the glass substrate, and the above issues existed in the PCB substrate would be completely avoided. Therefore, the glass substrate has strong competitiveness.

Some embodiments of the present disclosure provide a backlight module, including an optical film, and further including any of the above-described backplanes. The backlight module has advantages of low power consumption and long service life. For example, the optical film includes at least one of a light guide plate and a diffusion sheet. For example, the backlight module may further include structures such as driver circuit, which may be particularly determined according to actual demands, without describing the details here.

Some embodiments of the present disclosure further provide a display panel including any of the above-described backlight modules. For example, in the display panel, a display module, the optical film and the backplane are sequentially arranged.

The display panel provided by the embodiments of the present disclosure has advantages of low power consumption and long service life. The display panel may be a display device required for backlight module, for example, LCD, etc., and any product or component having display function and including such display device, e.g., television, digital camera, mobile phone and tablet computer, etc.

In the backplane illustrated in FIG. 1A, the micro LED 20 includes two pins. One of the two pins is connected with one conductive sub-layer, and the other one is connected with another conductive sub-layer, with the two conductive sub-layers being insulated from each other, so as to apply the two pins with voltages through the two different conductive sub-layers, respectively, thereby enabling the micro LED 20 to emit light. In FIG. 1A, pins included in the micro LED 20 are completely wrapped by the second protection layer 12. For example, the pins of the micro LED 20 are completely surrounded by the second protection layer 12, so as to isolate the pins from the metallic reflective layer 13. In this way, the pins of the micro LED 20 are insulated from the metallic reflective layer 13, and are also insulated from the antioxidation layer 17.

As illustrated in FIG. 1A, the pin of the micro LED 20 has a height smaller than the thickness of the second protection layer 12, so as to isolate the pin from the metallic reflective layer 13.

Figure 1B:
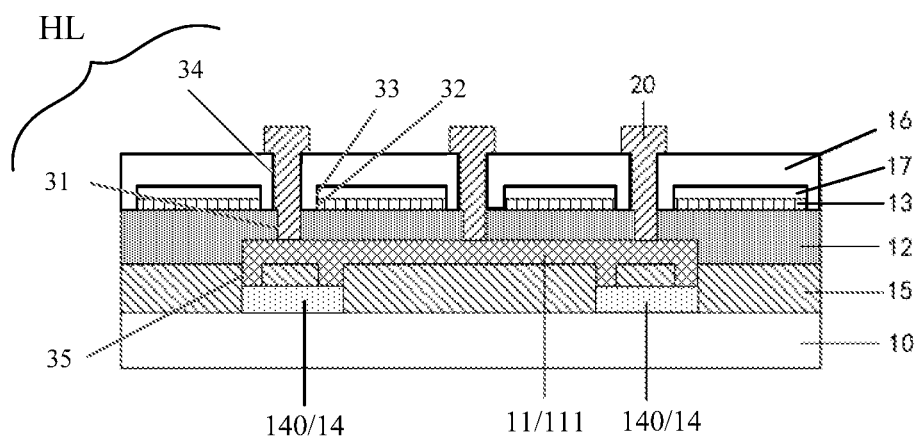
FIG. 1B is a structural diagram of a backplane provided by another embodiment of the present invention.

FIG. 1B is a structural diagram of a backplane provided by another embodiment of the present disclosure. As compared with the backplane illustrated in FIG. 1A, in the backplane illustrated in FIG. 1B, part of the third protection layer 16 is formed between the micro LED 20 and the metallic reflective layer 13, and another part of the third protection layer 13 is formed between the micro LED 20 and the antioxidation layer 17, so as to isolate the micro LED 20 from the metallic reflective layer 13 and to isolate the micro LED 20 from the antioxidation layer 17 in a better way.

For example, as illustrated in FIG. 1B, the second via hole 32 and the third via hole 33 have the same size; and the size of the second via hole 32 or the third via hole 33 is greater than a size of the first via hole 31 and is also greater than a size of the fourth via hole 34. When the third protection layer 13 and the second protection layer 12 are formed by using the same mask, the size of the first via hole 31 is as same as the size of the fourth via hole 34.

For example, as illustrated in FIG. 1B, the metallic reflective layer 13 and the antioxidation layer 17 are provided with a via hole; an orthographic projection of the via hole penetrating the third protection layer 16 and the second protection layer 12 on the base substrate 10 is completely within an orthographic projection of the via hole in the metallic reflective layer 13 and the antioxidation layer 17 on the base substrate 10.

For example, the third protection layer 16 completely covers the metallic reflective layer 13 and the antioxidation layer 17. For example, as illustrated in FIG. 1B, the metallic reflective layer 13 and the antioxidation layer 17 are completely wrapped by the third protection layer 16. The micro LED 20 is connected with the second conductive layer 11 through the via hole HL penetrating the third protection layer 16 and the second protection layer 12. The via hole HL includes the first via hole 31 and the fourth via hole 34.

Figure 1C:
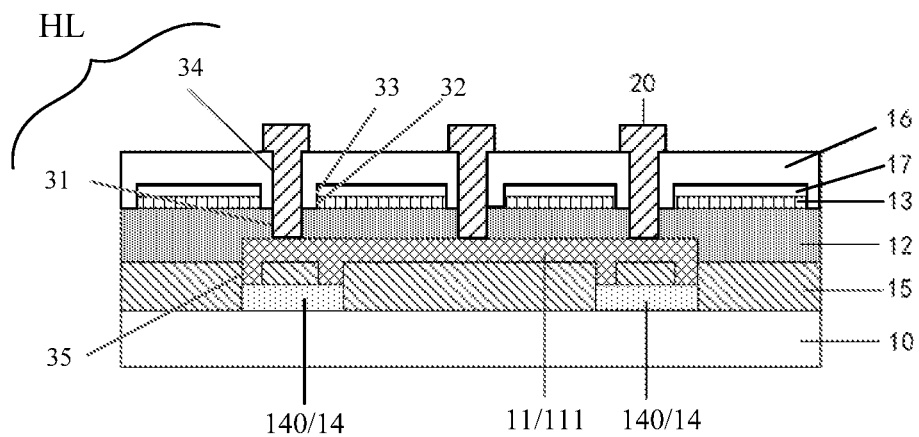
FIG. 1C is a structural diagram of a backplane provided by yet another embodiment of the present invention.

FIG. 1C is a structural diagram of a backplane provided by yet another embodiment of the present disclosure. As illustrated in FIG. 1C, the third protection layer 16 and the second protection layer 12 are formed by using the same mask, and the size of the first via hole 31 is as same as the size of the fourth via hole 34.

Figure 2:
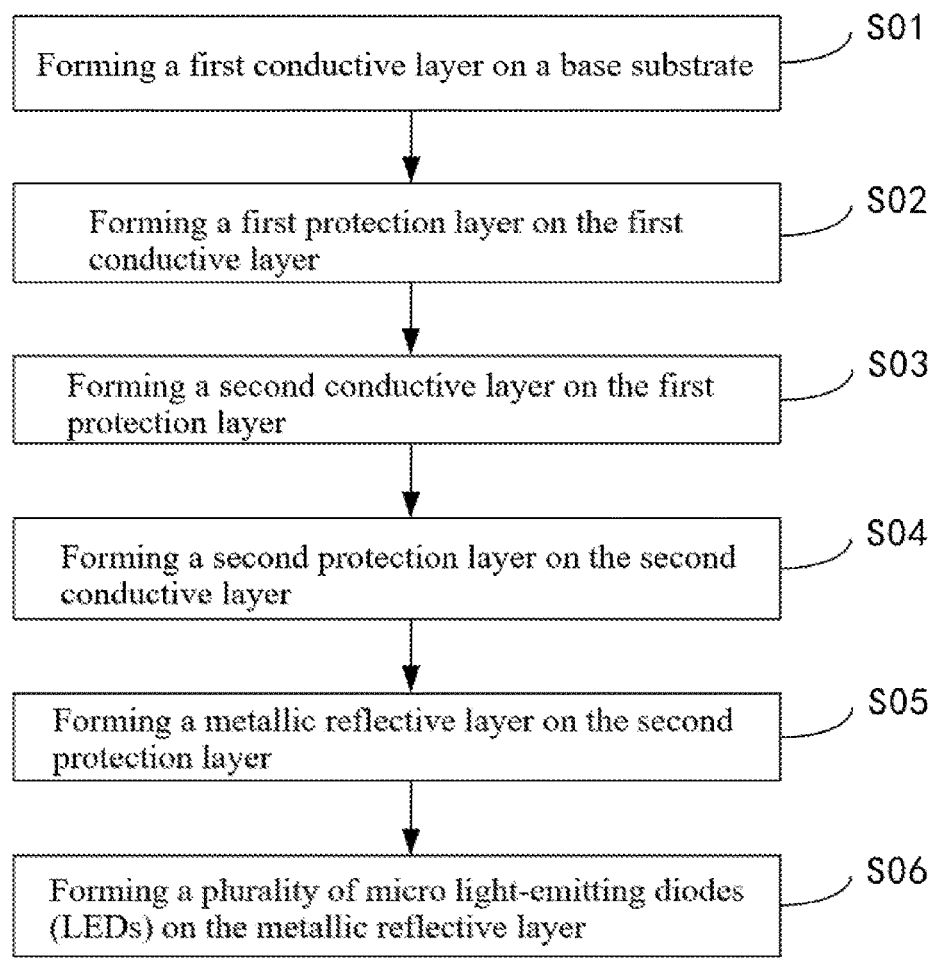
FIG. 2 is a flow chart of a manufacturing method of a backplane provided by an embodiment of the present disclosure.

Some embodiments of the present disclosure further provide a manufacturing method of a backplane. Referring to FIG. 2, the manufacturing method includes the following steps.

S01, forming a first conductive layer on a base substrate.

A material of the above-described base substrate is not limited in the embodiments of the present disclosure. The material may be a conventional base material for PCB, and may also be glass; of course, other base materials are also feasible, which may be determined according to actual conditions.

A material of the above-described first conductive layer is not limited in the embodiments of the present disclosure, but may be particularly determined according to actual conditions. The material of the first conducive layer may be a metal, for example, Cu (copper). Cu has good conductivity and facilitates to reduce a response time of the backplane. For example, if a size of the backplane is 12.3 cun-75 cun, a thickness of the Cu layer may be 1.8 μm-5.2 μm. For example, a thickness of the first protection layer may be 1.5-2 times of that of the Cu layer so as to effectively protect the Cu layer.

S02, forming a first protection layer on the first conductive layer.

Magnitudes of thicknesses of the first conductive layer and the first protection layer are not limited in the embodiments of the present disclosure. In order to protect the first conductive layer in a better way, the thickness of the first protection layer may be greater than the thickness of the first conductive layer.

A material of the first protection layer may be silicon nitride, and may also be other materials, of course, as long as it functions for insulation and protection.

S03, forming a second conductive layer on the first protection layer.

A material of the above-described second conducive layer may also be a metal, and may be as same as or different from the material of the first conductive layer. In order to lower the manufacturing difficulty and cost, the first conductive layer and the second conductive layer may be formed by using the same material.

S04, forming a second protection layer on the second conductive layer.

A material of the second protection layer may be silicon nitride, and may also be other materials, of course, as long as it functions for insulation and protection. The first protection layer and the second protection layer may be of the same material or different materials. In order to lower the manufacturing difficulty, the second protection layer and the first protection layer may be formed by using the same material.

Magnitudes of thicknesses of the second conductive layer and the second protection layer are not limited in the embodiments of the present disclosure. In order to protect the second conductive layer in a better way, the thickness of the second protection layer may be greater than the thickness of the second conductive layer.

S05, forming a metallic reflective layer on the second protection layer.

For example, a material of the metallic reflective layer may be a metal such as Ag (silver).

S06, forming a plurality of micro light-emitting diodes (LEDs) on the metallic reflective layer.

Methods for forming the first conductive layer, the first protection layer, the second conductive layer, the second protection layer and the metallic reflective layer are not limited in the embodiments of the present disclosure. By way of example, the above-described layer structures may be formed by using a patterning process. The patterning process is a process of forming a layer including at least one pattern from a thin film. The patterning process usually includes: coating photoresist (PR) onto a thin film; exposing the photoresist by using a mask; washing out a to-be-removed portion of the photoresist by using a developing solution to form a photoresist pattern; etching off a portion of the thin film not covered by the photoresist pattern by using the photoresist pattern as a mask; finally peeling off the remaining photoresist to form a desirable patterned layer. Of course, other forming methods may also be adopted, for example, laser printing or the like.

For example, the backplane includes at least one light-emitting region; the plurality of micro LEDs are divided into a plurality of micro LED groups according to the region where the micro LED is located; the micro LEDs included in each of the micro LED groups are all located in the same light-emitting region.

For example, the second conductive layer includes a plurality of conductive sub-layers which are not connected with each other, the plurality of conductive sub-layers are insulated from each other; each of the conductive sub-layers corresponds to one micro LED group, and each of the conductive sub-layers is electrically connected with the micro LEDs in the corresponding micro LED group.

For example, the first conductive layer includes a plurality of wires, each of the wires corresponds to one conductive sub-layer, and each of the wires is electrically connected with the corresponding conductive sub-layer.

For example, the backplane including at least one light-emitting region as mentioned above refers to that, the backplane may include only one light-emitting region, or the backplane may include two or more than two light-emitting regions. The particular number of the light-emitting regions may be determined according to the size of the backplane.

For example, the above-described one conductive sub-layer corresponds to one micro LED group, and is electrically connected with the micro LEDs in the micro LED group, so as to respectively regulate and control the micro LEDs in different light-emitting regions through the plurality of conductive sub-layers.

It should be noted that, the number of the above-described wire corresponding to one conductive sub-layer may be one, and may also be two or more than two; this number may be determined according to the number of the micro LEDs connected with this conducive sub-layer.

The embodiment of the present disclosure provides a manufacturing method of a backplane. In the backplane formed by using the manufacturing method, because the metallic reflective layer has a higher reflectivity, the light emitted by the micro LED towards the non-display side can be reflected to the light-emitting side as much as possible, so as to increase the utilization ratio of the micro LED, and hence to reduce the power consumption and extend the service life. At the same time, it also enables to achieve regional regulation and control of the micro LEDs and to provide a backlight source with higher quality.

Figure 3:
FIG. 3 is a structural diagram of a first conductive layer provided by an embodiment of the present disclosure.

Optionally, a thickness of the first conductive layer is smaller than or equal to a first thickness. For example, forming the first conductive layer on the base substrate includes: forming the first conductive layer 14 as illustrated in FIG. 3 by using a single patterning process.

The single patterning process as mentioned above is a process including steps of coating, masking, exposing, developing, etching and stripping. The above-described first thickness may be set according to the size of the backplane. By way of example, if the material of the first conductive layer is Cu and the size of the backplane is 12.3 cun-75 cun, the thickness of the Cu layer may be 1.8 μm-5.2 μm; in such case, the first thickness may be 2 μm.

Hereinafter, the method of forming the first conductive layer by using a single patterning process will be described with reference to the case where the material of the first conductive layer is Cu, by way of example. Firstly, forming a Cu film by multiple times of sputtering steps; then coating photoresist; then exposing the photoresist by using a mask; then washing out a to-be-removed portion of the photoresist by using a developing solution; then etching off a portion of the Cu film not covered by the photoresist; finally stripping off the remaining photoresist to form a desirable Cu pattern.

Optionally, the thickness of the first conductive layer is greater than the first thickness.

The step S01 of forming a first conductive layer on a base substrate includes following steps.

Figure 4:
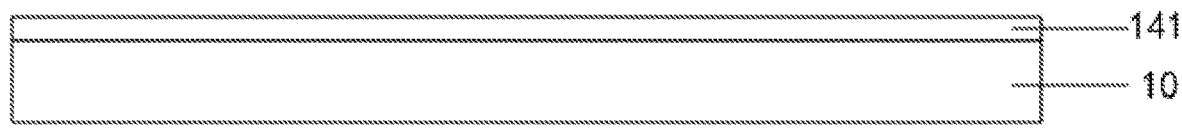
FIG. 4 is a structural diagram of a first conductive film formed on a base substrate provided by an embodiment of the present disclosure.

S401, referring to FIG. 4, forming a first conductive film 141 on a base substrate 10.

A material of the first conductive film may be a metal, for example, Cu. The method of forming the first conductive film is not limited in the embodiments of the present disclosure. By way of example, the first conductive film may be formed by multiple times of sputtering steps.

Figure 5:
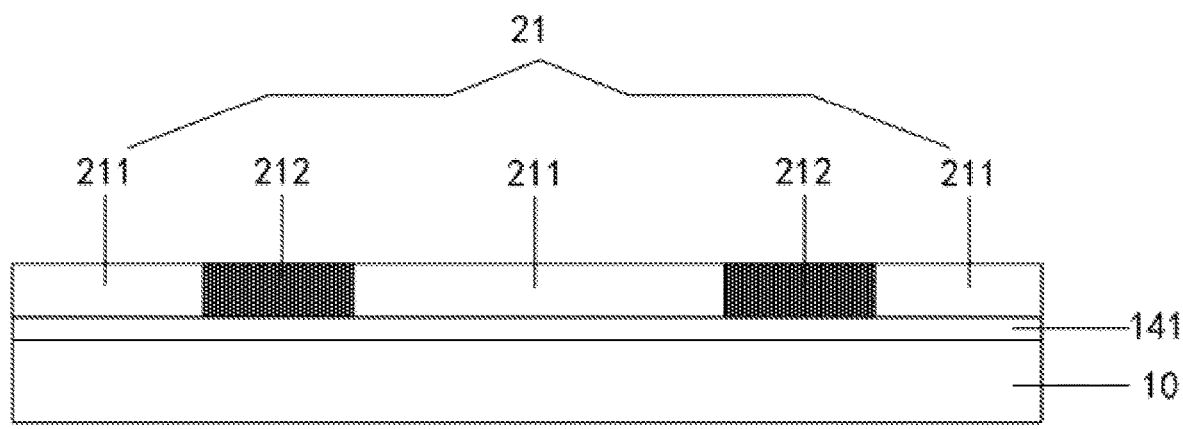
FIG. 5 is a structural diagram of photoresist covering a first conductive film provided by an embodiment of the present disclosure.

S402, referring to FIG. 5, forming photoresist 21 to cover the first conductive film 141, the photoresist 21 including a to-be-retained portion 211 and a to-be-removed portion 212.

Figure 6:
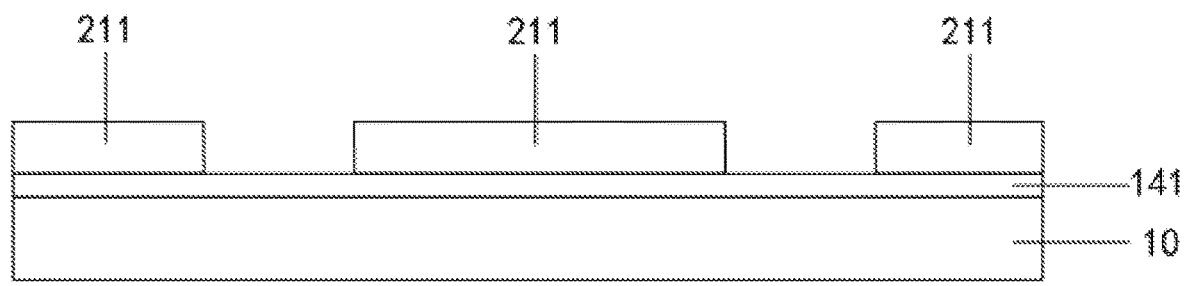
FIG. 6 is a schematic diagram illustrating a structure obtained after removing a to-be-removed portion from FIG. 5.

S403, referring to FIG. 6, removing the to-be-removed portion 211 to expose part of the first conductive film 141.

The removing step of S403 in the embodiment of the present disclosure may be implemented by exposing the photoresist by using a mask, then washing out the to-be-removed portion of the photoresist by using a developing solution. The structure obtained after removing the to-be-removed portion of the photoresist may be referred to FIG. 6.

Figure 7:
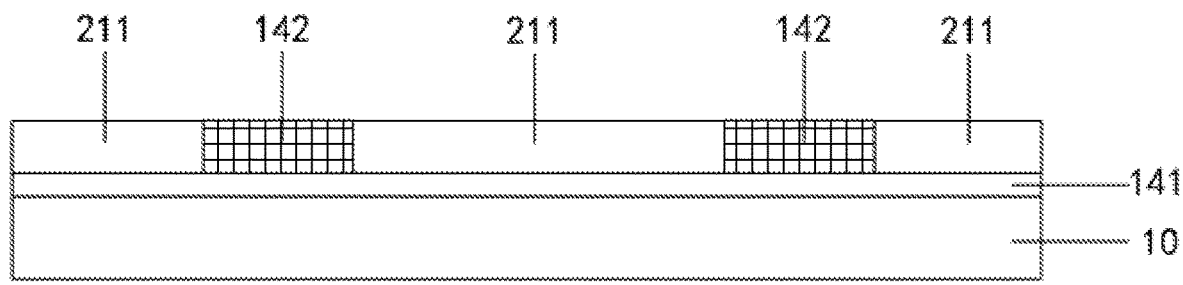
FIG. 7 is a structural diagram of a second conductive film provided by an embodiment of the present disclosure.

S404, referring to FIG. 7, forming a second conductive film 142 in a region of the first conductive film 141 not covered by the photoresist, by using an electroplating process.

The above-described first conductive film may be used as a seed layer, on which a material of the first conductive film is further deposited by using an electroplating process, so as to form the second conductive film. The electroplating process is to attach one layer of metallic film onto a surface of a metal or a work piece by utilizing electrolysis principle.

In some embodiments of the present disclosure, a thickness of the second conductive film may be greater than a thickness of the first conductive film. The thickness of the second conductive film may be in a range of 1.8 μm-10 μm, and the thickness of the first conductive film may be in a range of 0 μm-1.8 μm. Of course, the thickness of the first conductive film and the thickness of the second conductive film may also have other thickness ranges, which may be particularly determined according to actual conditions.

Figure 8:
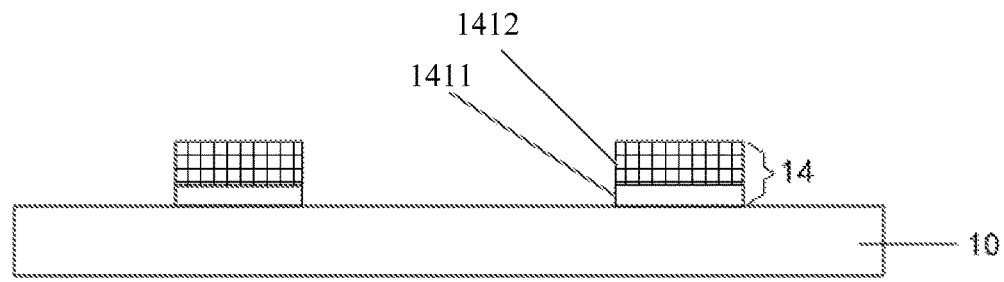
FIG. 8 is a structural diagram of another first conductive layer provided by an embodiment of the present disclosure.

S405, removing the to-be-retained portion and a portion of the first conductive film located below the to-be-retained portion, to form the first conductive film 14 as illustrated in FIG. 8.

For example, as illustrated in FIG. 8, each of wires of the first conductive film 14 includes two sub-layers, that is, a first sub-layer and a second sub-layer; the first sub-layer 1411 is closer to the base substrate 10 than the second sub-layer 1412 to the base substrate 10; a thickness of the first sub-layer 1411 is greater than 0 and smaller than or equal to 1.8 μm; a thickness of the second sub-layer 1412 is 1.8 μm-10 μm. For example, a material of the first sub-layer 1411 includes a metal, and a material of the second sub-layer 1412 includes a metal. For further example, the material of the first sub-layer 1411 includes Cu, and the material of the second sub-layer 1412 includes Cu, without limited thereto.

In some embodiments of the present disclosure, the removing step of S405 may be implemented by etching off the to-be-retained portion of the photoresist and the portion of the first conductive film located below the to-be-retained portion by using an etching solution.

Optionally, in order to prevent the metallic reflective layer from oxidation, after S05 of forming a metallic reflective layer on the second protection layer and before S06 of forming a plurality of micro LEDs on the metallic reflective layer, the above-described manufacturing method further includes the following step.

S07, forming an antioxidation layer on the metallic reflective layer.

In some embodiments of the present disclosure, a material of the antioxidation layer is not particularly limited. By way of example, if the material of the metallic reflective layer is Ag, the material of the antioxidation layer may be ITO. In such case, the reflectivity of the metallic reflective layer is raised by at least 5% with respect to the photosensitive white oil.

Optionally, in order to further protect the metallic reflective layer, after S05 of forming a metallic reflective layer on the second protection layer and before S06 of forming a plurality of micro light-emitting diodes (LEDs) on the metallic reflective layer, the above-described manufacturing method further includes the following step.

S08, forming a third protection layer on the antioxidation layer.

A material of the above-described third protection layer may be as same as or different from that of the first protection layer and the second protection layer, respectively. In order to lower the manufacturing difficulty, the third protection layer, the second protection layer and the first protection layer may be formed by using the same material. When the third protection layer and the second protection layer are of the same material, they may also share the same mask to lower the manufacturing cost.

Hereinafter the manufacturing method of the backplane will be described in details with reference to the case where the material of the base substrate is glass, the materials of both of the first conductive layer and the second conductive layer are Cu, the material of the metallic reflective layer is Ag and the material of the antioxidation layer is ITO, by way of example.

The manufacturing method of the backplane includes following steps.

Figure 9:
FIG. 9 is a structural diagram of yet another first conductive layer provided by an embodiment of the present disclosure.

S501, referring to FIG. 9, forming a first conductive layer 14 on a base substrate 10 by a patterning process.

Figure 10:
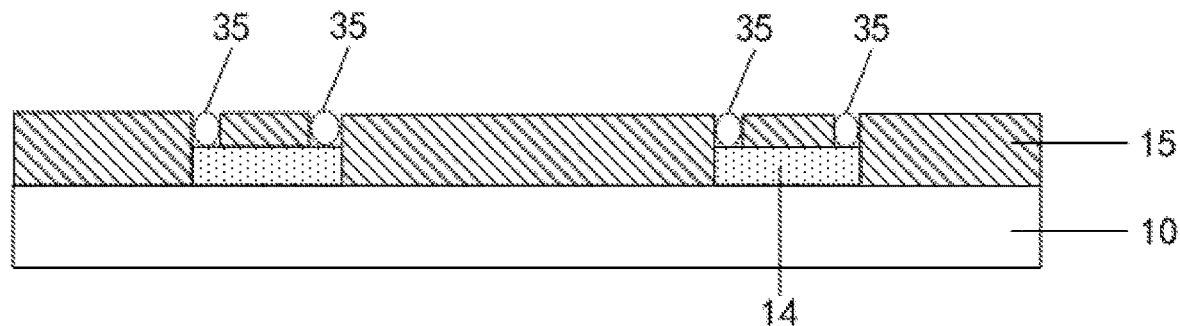
FIG. 10 is a structural diagram of a first protection layer formed on a first conductive layer provided by an embodiment of the present disclosure.

S502, referring to FIG. 10, forming a first protection layer 15 on the first conductive layer 14 by a patterning process. The first protection layer 15 is provided with a plurality of fifth via holes 35. FIG. 10 is drawn with reference to the case where the first protection layer is provided with four fifth via holes, by way of example.

Figure 11:
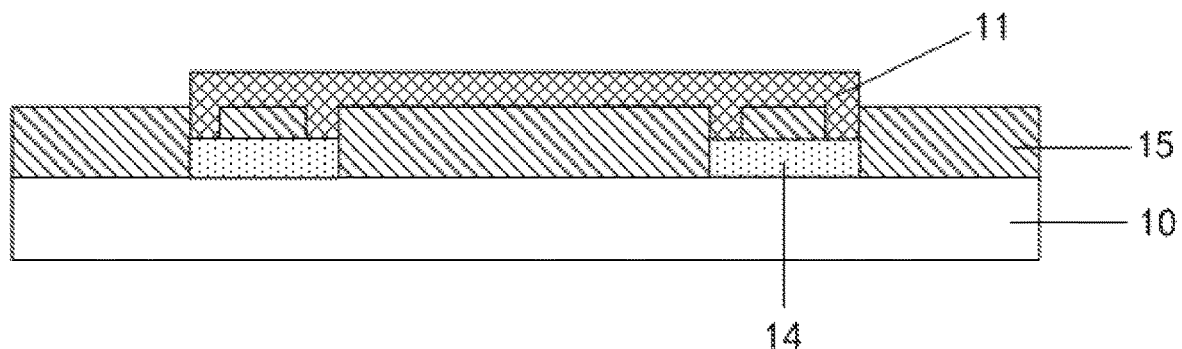
FIG. 11 is a structural diagram of a second conductive layer formed on a first protection layer provided by an embodiment of the present disclosure.

S503, referring to FIG. 11, forming a second conductive layer 11 on the first protection layer 15 by a patterning process. The second conductive layer 11 is connected with the first conductive layer 14 through the fifth via hole (not labeled in FIG. 11).

Figure 12:
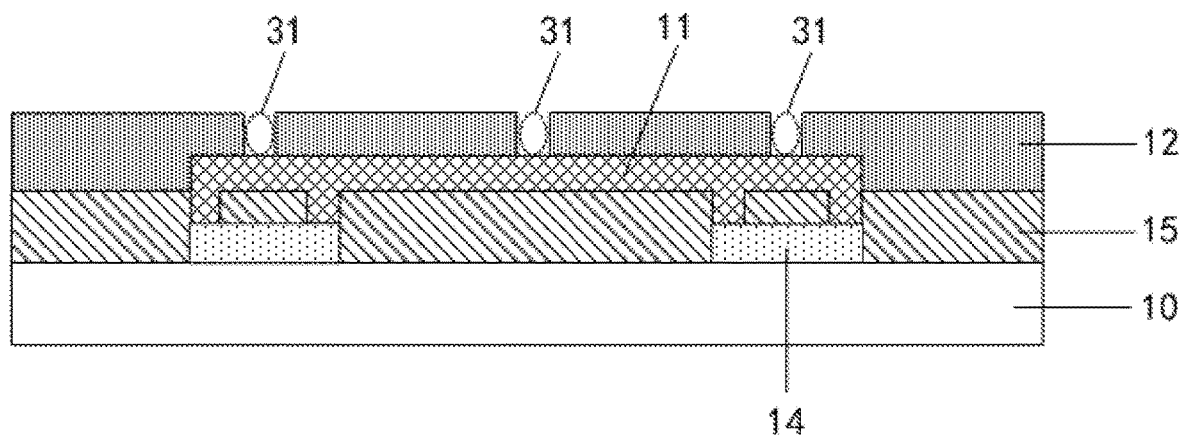
FIG. 12 is a structural diagram of a second protection layer formed on a second conductive layer provided by an embodiment of the present disclosure.

S504, referring to FIG. 12, forming a second protection layer 12 on the second conductive layer 11 by a patterning process. The second protection layer 12 is provided with a plurality of first via holes 31. FIG. 12 is drawn with reference to the case where the second protection layer is provided with three first via holes 31, by way of example.

Figure 13:
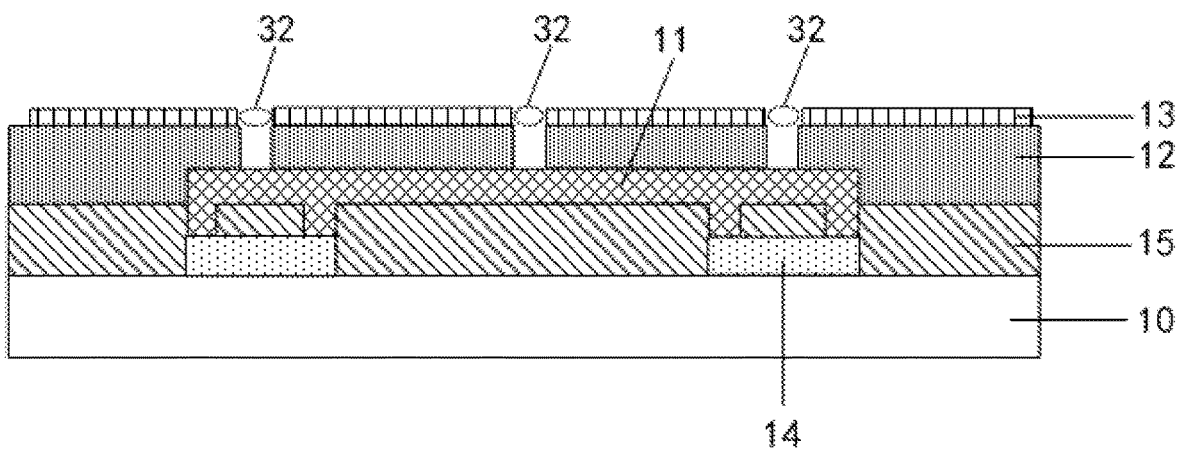
FIG. 13 is a structural diagram of a metallic reflective layer formed on a second protection layer provided by an embodiment of the present disclosure.

S505, referring to FIG. 13, forming a metallic reflective layer 13 on the second protection layer 12 by a patterning process. The metallic reflective layer 13 is provided with a plurality of second via holes 32. FIG. 13 is drawn with reference to the case where the metallic reflective layer is provided with three second via holes 32, by way of example.

Figure 14:
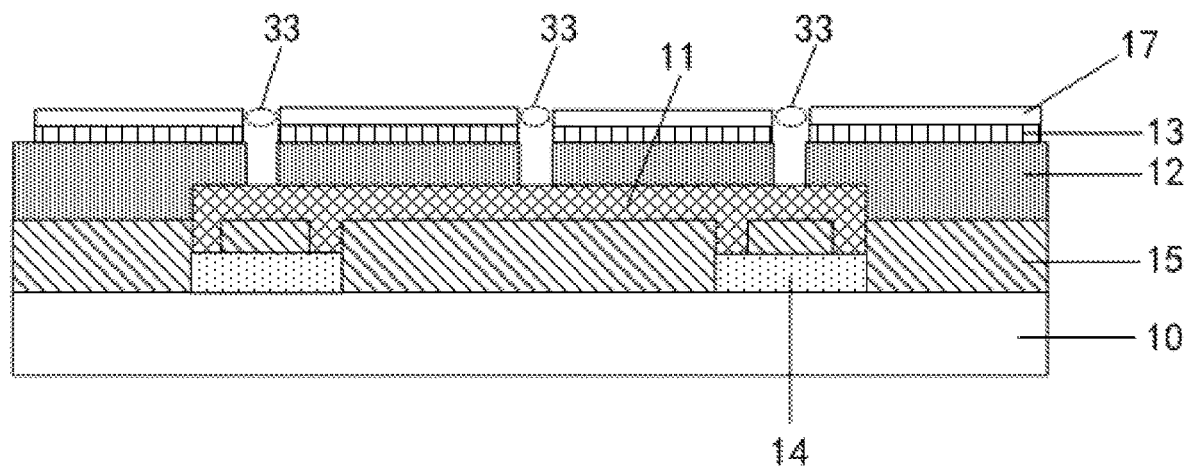
FIG. 14 is a structural diagram of an antioxidation layer formed on a metallic reflective layer provided by an embodiment of the present disclosure.

S506, referring to FIG. 14, forming an antioxidation layer 17 on the metallic reflective layer 13 by a patterning process. The antioxidation layer 17 is provided with a plurality of third via holes 33. FIG. 14 is drawn with reference to the case where the antioxidation layer is provided with three third via holes 33, by way of example.

The above-described metallic reflective layer and antioxidation layer may be formed by a single patterning process. The single patterning process includes steps of coating, masking, exposing, developing, etching, stripping and the like. In the exposing stage, yellow light may be adopted for exposing (i.e., yellow light etching process); of course, light of other colors (e.g., white light) may also be adopted, without particularly limited here. Taking the performance of the device into consideration, yellow light may be used for exposing.

Figure 15:
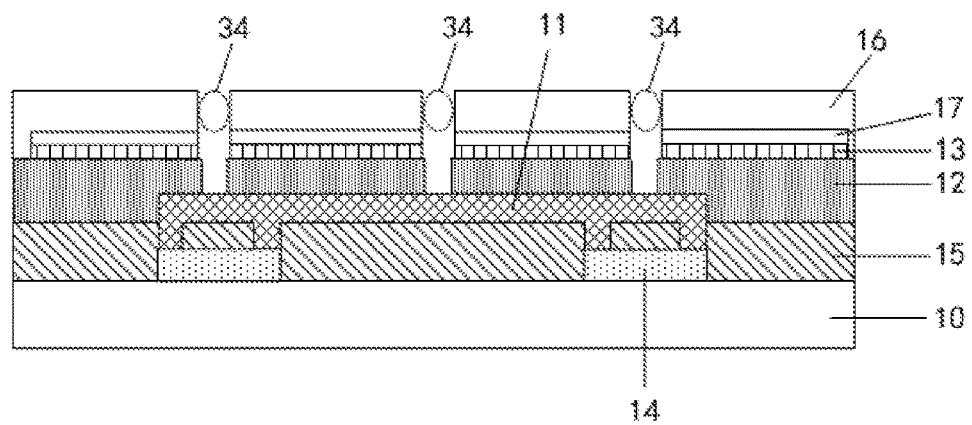
FIG. 15 is a structural diagram of a third protection layer formed on an antioxidation layer provided by an embodiment of the present disclosure.

S507, referring to FIG. 15, forming a third protection layer 16 on the antioxidation layer 17 by a patterning process. The third protection layer 16 is provided with a plurality of fourth via holes 34. The third protection layer 16 and the second protection layer 12 are of the same material, and share the same mask.

S508, cutting the above-described substrate according to a size required by a customer.

S509, forming a plurality of micro LEDs on the sized-substrate obtained by cutting (this step may be referred to as LED bonding). Referring to FIG. 1A, the micro LEDs 20 are connected with the first conductive layer 11 through the first via hole 31, the second via hole 32, the third via hole 33 and the fourth via hole 34.

S510, bonding a circuit board onto the sized substrate. The circuit board may be a flexible printed circuit (FPC), and this step may be referred to as FPC Bonding. For example, the circuit board may be bonded onto the sized substrate through a via hole in the third protection layer and the first protection layer.

All the flow processes above can be implemented in a panel factory without the need of entrusting other factories. The manufacturing method above can be implemented on a glass substrate without any restriction to the manufacturing size; the metallic reflective film is used to replace the photosensitive white oil and has a reflectivity raised by more than 5% with respect to the white oil. Subsequent processes such as optical film (e.g., diffusion sheet, light guide plate and the like) assembling process may be implemented in a backlight factory, and finally a Mini LED backlight module is finished in the backlight factory for shipment.

The backplane formed by adopting the above-described manufacturing method is illustrated in FIG. 1A or FIG. 1B.

Figure 16:
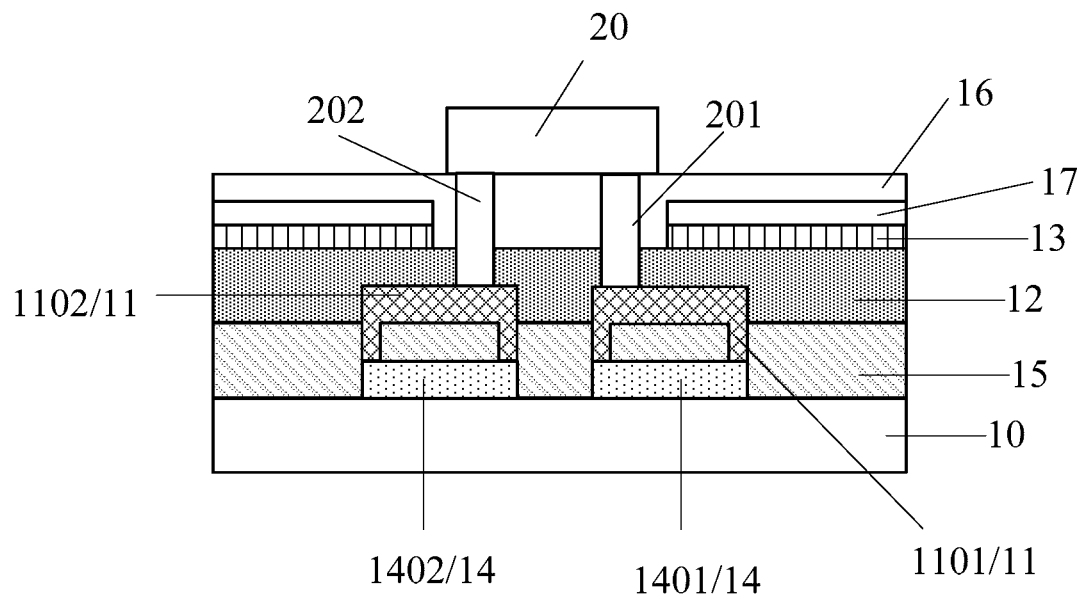
FIG. 16 is a cross-sectional view of a backplane provided by an embodiment of the present disclosure.

FIG. 16 is a cross-sectional view of a backplane provided by an embodiment of the present disclosure. As illustrated in FIG. 16, the micro LED 20 includes a first pin 201 and a second pin 202. The first conductive layer 14 includes a first wire 1401 and a second wire 1402. The second conductive layer 11 includes a first conductive sub-layer 1101 and a second conductive sub-layer 1102. The first pin 201 is connected with the first wire 1401 through the first conductive sub-layer 1101; the second pin 202 is connected with the second wire 1402 through the second conductive sub-layer 1102; the first pin 201 and the second pin 202 are applied with different voltages, respectively, so as to enable the micro LED 20 to emit light.

For example, the backplane includes a plurality of first wires 1401 and a plurality of second wires 1402. For example, the backplane incudes a plurality of first conductive sub-layers 1101 and a plurality of second conductive sub-layers 1102.

The conductive sub-layer 111 illustrated in FIG. 1A to FIG. 1C may be the first conductive sub-layer 1101 or the second conductive sub-layer 1102. The wire illustrated in FIG. 1A to FIG. 1C may be two first wires 1401 or two second wires 1402.

Figure 17:
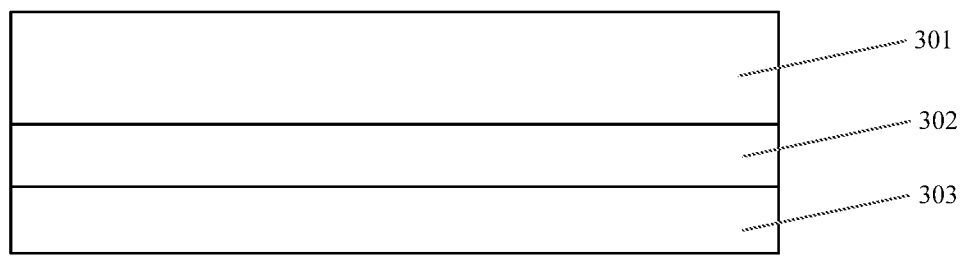
FIG. 17 is a schematic diagram of a display panel provided by an embodiment of the present disclosure.

FIG. 17 is a schematic diagram of a display panel provided by an embodiment of the present disclosure. As illustrated in FIG. 17, the display module 301, the optical film 302 and the backplane 303 of the display panel are sequentially arranged. The backplane 303 may be any of the above-described backplanes.

In the backplane and the manufacturing method thereof provided in the embodiments of the present disclosure, because the metallic reflective layer has a higher reflectivity, the light emitted by the micro LED towards the non-display side can be reflected to the light-emitting side as much as possible, so as to increase the utilization ratio of the micro LED, and hence to reduce the power consumption and extend the service life.

For example, in the embodiments of the present disclosure, a height or a thickness of an element refers to a size of the element in a direction perpendicular to the base substrate.

The above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A backplane, comprising:
a base substrate;
a first conductive layer located on the base substrate, the first conductive layer comprising a wire;
a first protection layer located at a side of the first conductive layer facing away from the base substrate;
a second conductive layer located at a side of the first protection layer facing away from the base substrate, the second conductive layer comprising a conductive sub-layer, the conductive sub-layer penetrating the first protection layer and connected with the wire;
a second protection layer located at a side of the second conductive layer facing away from the base substrate;
a micro light-emitting diode (LED) penetrating the second protection layer and connected with the conductive sub-layer;
a metallic reflective layer, located at a side of the second protection layer facing away from the base substrate and configured to reflect light irradiated onto the metallic reflective layer from the micro LED;
an antioxidation layer located between the metallic reflective layer and the micro LED; and
a third protection layer located between the antioxidation layer and the micro LED.

2. The backplane according to claim 1, wherein the third protection layer completely covers both of the metallic reflective layer and the antioxidation layer.

3. The backplane according to claim 2, wherein the micro LED is connected with the conductive sub-layer through a via hole penetrating the third protection layer and the second protection layer.

4. The backplane according to claim 3, wherein the metallic reflective layer and the antioxidation layer are provided with a via hole,
an orthographic projection of the via hole penetrating the third protection layer and the second protection layer on the base substrate is completely within an orthographic projection of the via hole in the metallic reflective layer and the antioxidation layer on the base substrate.

5. The backplane according to claim 1, wherein the second protection layer, the metallic reflective layer, the antioxidation layer, and the third protection layer are provided with a first via hole, a second via hole, a third via hole, and a fourth via hole, respectively,
the micro LED is connected with the conductive sub-layer through the first via hole, the second via hole, the third via hole, and the fourth via hole.

6. The backplane according to claim 5, wherein a pin of the micro LED has a height smaller than a thickness of the second protection layer so as to isolate the pin from the metallic reflective layer.

7. The backplane according to claim 1, wherein the wire comprises a first sub-layer and a second sub-layer which are stacked,
the first sub-layer is closer to the base substrate than the second sub-layer to the base substrate, and
a thickness of the first sub-layer is smaller than a thickness of the second sub-layer.

8. The backplane according to claim 1, wherein a material of the metallic reflective layer comprises Ag, and a material of the antioxidation layer comprises indium tin oxide (ITO).

9. The backplane according to claim 1, wherein a material of the base substrate is glass.

10. A backlight module, comprising the backplane according to claim 1 and an optical film.

11. A display panel, comprising the backlight module according to claim 10 and a display module, wherein the display module, the optical film, and the backplane are sequentially arranged.

12. The backplane according to claim 1, wherein a thickness of the first protection layer is greater than a thickness of the first conductive layer, and a thickness of the second protection layer is greater than a thickness of the second conductive layer.

13. A manufacturing method of a backplane, comprising:
forming a first conductive layer on a base substrate, the first conductive layer comprising a wire;
forming a first protection layer on the first conductive layer;
forming a second conductive layer on the first protection layer, the second conductive layer comprising a conductive sub-layer, the conductive sub-layer penetrating the first protection layer and connected with the wire;
forming a second protection layer on the second conductive layer;
providing a micro light-emitting diode (LED), the micro LED penetrating the second protection layer and connected with the conductive sub-layer; and
forming a metallic reflective layer on the second protection layer, the metallic reflective layer being configured to reflect light irradiated on the metallic reflective layer from the micro LED,
wherein, after forming the metallic reflective layer and before providing the micro LED, the manufacturing method further comprises; forming an antioxidation layer,
wherein after forming the antioxidation layer and before providing the micro LED, the manufacturing method further comprises; forming a third protection layer,
wherein the forming the third protection layer and the forming the second protection layer comprise using a same mask, and
the micro LED is connected with the conductive sub-layer through a via hole penetrating the third protection layer and the second protection layer.

14. The manufacturing method of the backplane according to claim 13, wherein forming the wire in the first conductive layer comprises: forming a first sub-layer and a second sub-layer that are stacked on the base substrate, wherein
the first sub-layer is closer to the base substrate than the second sub-layer to the base substrate, and
a thickness of the first sub-layer is smaller than a thickness of the second sub-layer.

15. A manufacturing method of a backplane, comprising:
forming a first conductive layer on a base substrate, the first conductive layer comprising a wire;

forming a first protection layer on the first conductive layer;

forming a second conductive layer on the first protection layer, the second conductive layer comprising a conductive sub-layer, the conductive sub-layer penetrating the first protection layer and connected with the wire;

forming a second protection layer on the second conductive layer;

providing a micro light-emitting diode (LED), the micro LED penetrating the second protection layer and connected with the conductive sub-layer; and forming a metallic reflective layer on the second protection layer, the metallic reflective layer being configured to reflect light irradiated on the metallic reflective layer from the micro LED, wherein, after forming the metallic reflective layer and before providing the micro LED, the manufacturing method further comprises; forming an antioxidation layer, wherein forming the wire in the first conductive layer comprises: forming a first sub-layer and a second sub-layer that are stacked on the base substrate, wherein the first sub-layer is closer to the base substrate than the second sub-layer to the base substrate, and a thickness of the first sub-layer is smaller than a thickness of the second sub-layer, wherein the forming the first sub-layer and the second sub-layer that are stacked comprises:

forming a first conductive film on the base substrate;

forming photoresist to cover the first conductive film, the photoresist comprising a to-be-retained portion and a to-be-removed portion;

removing the to-be-removed portion to expose part of the first conductive film;

forming a second conductive film in a region of the first conductive film not covered by the photoresist by using an electroplating process; and removing the to-be-retained portion and a portion of the first conductive film located below the to-be-retained portion, to form the first sub-layer and the second sub-layer that are stacked.

* * * * *